(12) United States Patent
Johanson et al.

(10) Patent No.: US 10,283,334 B2
(45) Date of Patent: May 7, 2019

(54) METHODS AND APPARATUS FOR MAINTAINING LOW NON-UNIFORMITY OVER TARGET LIFE

(71) Applicant: APPLIED MATERIALS, INC., Santa Clara, CA (US)

(72) Inventors: William Johanson, Gilroy, CA (US); Fuhong Zhang, Cupertino, CA (US); Adolph Miller Allen, Oakland, CA (US); Yu Liu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 599 days.

(21) Appl. No.: 14/522,066

(22) Filed: Oct. 23, 2014

(65) Prior Publication Data

US 2016/0056024 A1  Feb. 25, 2016

Related U.S. Application Data

(60) Provisional application No. 62/040,837, filed on Aug. 22, 2014.

(51) Int. Cl.
*C23C 14/34* (2006.01)
*H01J 37/34* (2006.01)
(Continued)

(52) U.S. Cl.
CPC ........ *H01J 37/347* (2013.01); *C23C 14/3492* (2013.01); *C23C 14/50* (2013.01);
(Continued)

(58) Field of Classification Search
CPC .......... H01J 37/32733; H01J 37/32623; C23C 14/54; C23C 14/542
See application file for complete search history.

(56) References Cited

U.S. PATENT DOCUMENTS 5,540,821 A * 7/1996 Tepman ............ H01L 21/68792
118/500
5,558,749 A * 9/1996 Yokoyama .......... H01J 37/3408
204/192.12

(Continued)

OTHER PUBLICATIONS

International Search Report and Written Opinion dated Sep. 30, 2015 for PCT Application No. PCT/US2015/043441.

(Continued)

*Primary Examiner* — Jason Berman
(74) *Attorney, Agent, or Firm* — Moser Taboada; Alan Taboada

(57) ABSTRACT

Embodiments of improved methods and apparatus for maintaining low non-uniformity over the course of the life of a target are provided herein. In some embodiments, a method of processing a substrate in a physical vapor deposition chamber includes: disposing a substrate atop a substrate support having a cover ring that surrounds the substrate support such that an upper surface of the substrate is positioned at a first distance above an upper surface of the cover ring; sputtering a source material from a target disposed opposite the substrate support to deposit a film atop the substrate while maintaining the first distance; and lowering the substrate support with respect to the cover ring and sputtering the source material from the target to deposit films atop subsequent substrates over a life of the target.

15 Claims, 3 Drawing Sheets

(51) Int. Cl.
　　　*C23C 14/54*　　　(2006.01)
　　　*H01J 37/32*　　　(2006.01)
　　　*C23C 14/50*　　　(2006.01)

(52) U.S. Cl.
　　　CPC ............ *C23C 14/54* (2013.01); *C23C 14/542* (2013.01); *H01J 37/32623* (2013.01); *H01J 37/32733* (2013.01); *H01J 2237/026* (2013.01)

(56) References Cited

U.S. PATENT DOCUMENTS

| | | |
|---|---|---|
| 6,416,635 B1 * | 7/2002 | Hurwitt .................. C23C 14/34 204/192.12 |
| 6,533,868 B1 | 3/2003 | Green et al. |
| 8,558,299 B2 | 10/2013 | Cao et al. |
| 8,580,092 B2 | 11/2013 | Hawrylchak et al. |
| 8,778,806 B2 | 7/2014 | Johnson et al. |
| 8,865,012 B2 | 10/2014 | Ge et al. |
| 9,834,840 B2 | 12/2017 | Rasheed et al. |
| 2003/0150720 A1 | 8/2003 | Green |
| 2009/0260982 A1 | 10/2009 | Riker et al. |
| 2011/0083960 A1 | 4/2011 | Yang et al. |
| 2013/0319854 A1 | 12/2013 | Parkhe et al. |
| 2014/0102890 A1 | 4/2014 | Jung et al. |
| 2014/0262763 A1 | 9/2014 | Rasheed et al. |

OTHER PUBLICATIONS

Search Report from The State Intellectual Property of the People's Republic of China dated Aug. 14, 2018 received for China Patent Application No. 2015800438112.

* cited by examiner

METHODS AND APPARATUS FOR MAINTAINING LOW NON-UNIFORMITY OVER TARGET LIFE

CROSS-REFERENCE TO RELATED APPLICATIONS

This application claims benefit of U.S. provisional patent application Ser. No. 62/040,837, filed Aug. 22, 2014, which is herein incorporated by reference in its entirety.

FIELD

Embodiments of the present disclosure generally relate to substrate processing systems.

BACKGROUND

Physical vapor deposition (PVD) processes can use radio frequency (RF) energy to enhance substrate processing for certain applications. For example, RF energy may be provided to a target of a PVD chamber to facilitate sputtering of materials from the target and depositing the sputtered materials onto a substrate disposed in the PVD chamber. The inventors have observed that process non-uniformity issues, such as non-uniform film deposition, may arise in such PVD chambers under certain operating conditions. The inventors believe that such non-uniform film deposition may occur due to a change in deposition rate across a substrate over the course of the life of a target.

Accordingly, the inventors have provided improved methods and apparatus for maintaining low non-uniformity over the course of the life of a target.

SUMMARY

Embodiments of improved methods and apparatus for maintaining low non-uniformity over the course of the life of a target are provided herein. In some embodiments, a method of processing a substrate in a physical vapor deposition chamber includes: disposing a substrate atop a substrate support having a cover ring that surrounds the substrate support such that an upper surface of the substrate is positioned at a first distance above an upper surface of the cover ring; sputtering a source material from a target disposed opposite the substrate support to deposit a film atop the substrate while maintaining the first distance; and lowering the substrate support with respect to the cover ring and sputtering the source material from the target to deposit films atop subsequent substrates over a life of the target.

In some embodiments, a physical vapor deposition chamber includes: a chamber body having a first volume; a chamber lid comprising a target assembly disposed atop the chamber body; a substrate support disposed within the first volume, opposite the target assembly, and having a substrate supporting surface; a shield disposed within the chamber body comprising one or more sidewalls configured to surround the first volume, wherein the shield extends downward to below a top surface of the substrate support, radially inward, and then returns upward to form an upwardly extending lip; a first ring having a first portion and a second portion, wherein the first portion comprises an opening having a ceramic isolator disposed therein, wherein the ceramic isolator rests on the top of the upwardly extending lip of the shield, and wherein the second portion extends away from the first portion toward the substrate supporting surface, and wherein the substrate support, over a course of a life of the target, is configured to raise and lower, relative to the first ring, a substrate disposed on the substrate supporting surface; and a second ring disposed about a peripheral edge of the substrate support and adjacent to the substrate supporting surface.

In some embodiments, a method of processing a plurality of substrates in a physical vapor deposition chamber includes: (a) sputtering a source material from a target spaced opposite a substrate to deposit a film atop the substrate, wherein the substrate is disposed atop a substrate support having a cover ring that surrounds the substrate support such that an upper surface of the substrate is positioned at a first distance from an upper surface of the cover ring; (b) lowering the substrate support; (c) sputtering the source material from the target to deposit a film atop a subsequent substrate at a next position provided by the lowered substrate; and (d) repeating (b)-(c) until the source material from the target is consumed.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
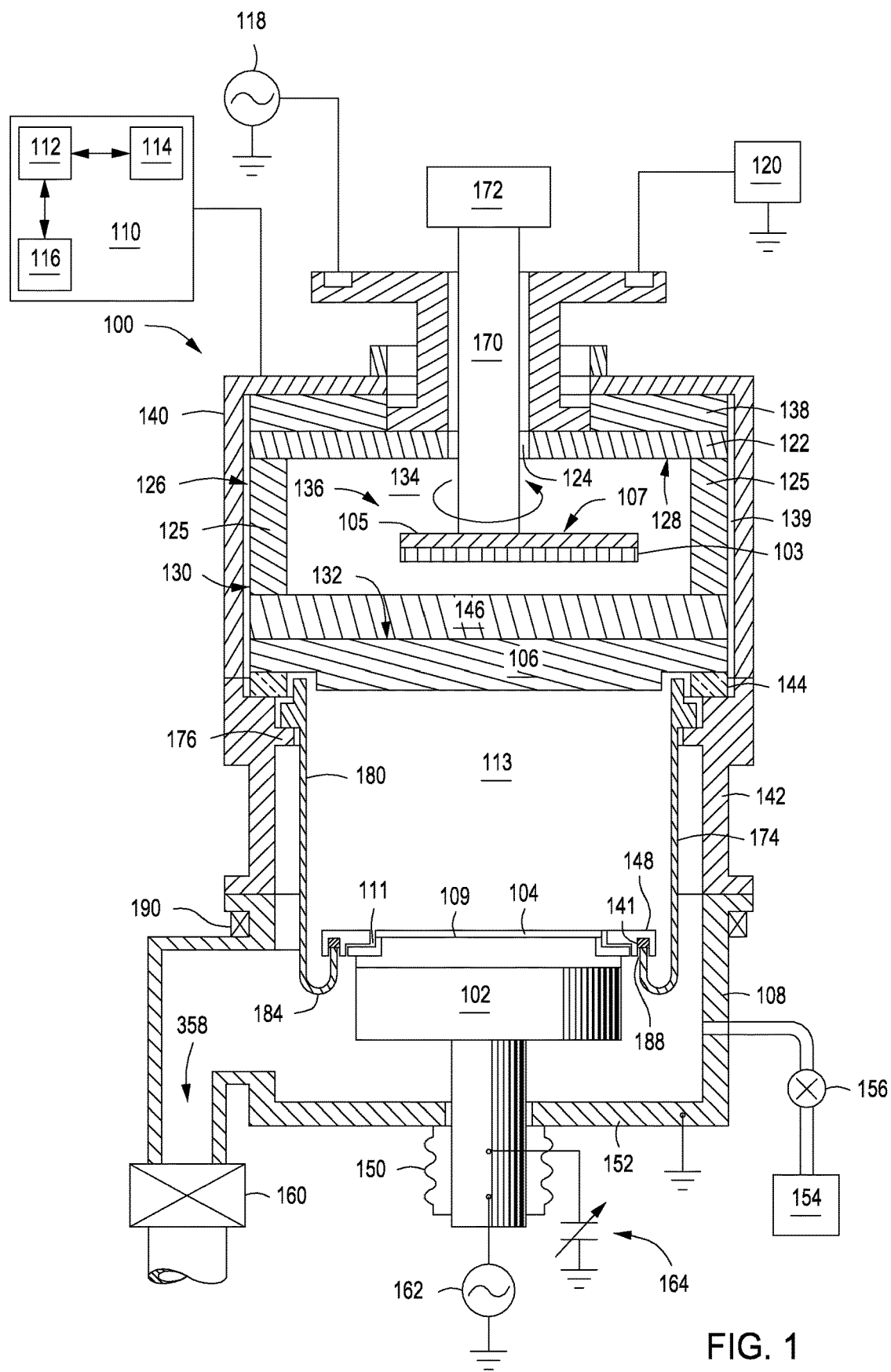
FIG. 1 depicts a schematic cross sectional view of a process chamber having a substrate support in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Improved methods and apparatus for maintaining low non-uniformity over the course of the life of a target are provided herein. When depositing a film via a physical vapor deposition process, embodiments of the inventive process and apparatus described herein advantageously maintain a low film non-uniformity profile over the life of a target.

FIG. 1 depicts a simplified, cross-sectional view of a physical vapor deposition (PVD) chamber (chamber 100), suitable for performing the method 200 described below. Examples of PVD chambers suitable for modification in accordance with the teachings provided herein include chambers having very high frequency (VHF) sources, the ALPS® Plus and SIP ENCORE® PVD processing chambers, both commercially available from Applied Materials, Inc., of Santa Clara, Calif. Other processing chambers from Applied Materials, Inc. or other manufacturers may also benefit from modifications in accordance with the inventive apparatus disclosed herein and be used to perform embodiments of the inventive methods disclosed herein.

The chamber 100 contains a substrate support 102 for receiving a substrate 104 on the substrate support, and a sputtering source, such as a target 106. In some embodiments, the substrate support is configured as an electrostatic chuck The substrate support 102 may be located within a grounded enclosure wall (e.g., chamber wall 108), which may be a chamber wall (as shown) or a grounded shield (a ground shield 140 is shown covering at least some portions of the chamber 100 above the target 106. In some embodiments, the ground shield 140 could be extended below the target to enclose the substrate support 102 as well).

In some embodiments, the process chamber includes a feed structure for coupling RF and DC energy to the target 106. The feed structure is an apparatus for coupling RF and DC energy to the target, or to an assembly containing the target, for example, as described herein. A first end of the feed structure can be coupled to an RF power source 118 and a DC power source 120, which can be respectively utilized to provide RF and DC energy to the target 106. For example, the DC power source 120 may be utilized to apply a negative voltage, or bias, to the target 106. In some embodiments, RF energy supplied by the RF power source 118 may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies. The feed structure may be fabricated from suitable conductive materials to conduct the RF and DC energy from the RF power source 118 and the DC power source 120. In some embodiments, about 6 kW of 40 MHz RF is provided at the same time about 1 kW of DC power is provided to produce the desired particle properties. In some embodiments, the RF power is provided at about 4 kW to about 8 Kw at a frequency of about 13.56 MHz to about 60 MHz, and the DC power simultaneously at about 0.5 kW to about 2 kW.

In some embodiments, the feed structure may have a suitable length that facilitates substantially uniform distribution of the respective RF and DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RF energy is more uniformly distributed about the feed structure to approximate RF coupling to the true center point of the feed structure). The inner diameter of the feed structure may be as small as possible, for example, from about 1 inch to about 6 inches, or about 4 inches in diameter. Providing a smaller inner diameter facilitates improving the length to ID ratio without increasing the length of the feed structure.

The second end of the feed structure may be coupled to a source distribution plate 122. The source distribution plate includes a hole 124 disposed through the source distribution plate 122 and aligned with a central opening of the feed structure. The source distribution plate 122 may be fabricated from suitable conductive materials to conduct the RF and DC energy from the feed structure.

The source distribution plate 122 may be coupled to the target 106 via a conductive member 125. The conductive member 125 may be a tubular member having a first end 126 coupled to a target-facing surface 128 of the source distribution plate 122 proximate the peripheral edge of the source distribution plate 122. The conductive member 125 further includes a second end 130 coupled to a source distribution plate-facing surface 132 of the target 106 (or to the backing plate 146 of the target 106) proximate the peripheral edge of the target 106.

A cavity 134 may be defined by the inner-facing walls of the conductive member 125, the target-facing surface 128 of the source distribution plate 122 and the source distribution plate-facing surface 132 of the target 106. The cavity 134 is fluidly coupled to the central opening of the body via the hole 124 of the source distribution plate 122. The cavity 134 and the central opening of the body may be utilized to at least partially house one or more portions of a rotatable magnetron assembly 136. In some embodiments, the cavity may be at least partially filled with a cooling fluid, such as water ($H_2O$) or the like.

A ground shield 140 may be provided to cover the outside surfaces of the lid of the chamber 100. The ground shield 140 may be coupled to ground, for example, via the ground connection of the chamber body. The ground shield 140 has a central opening to allow the feed structure to pass through the ground shield 140 to be coupled to the source distribution plate 122. The ground shield 140 may comprise any suitable conductive material, such as aluminum, copper, or the like. An insulative gap 139 is provided between the ground shield 140 and the outer surfaces of the source distribution plate 122, the conductive member 125, and the target 106 (and/or backing plate 146) to prevent the RF and DC energy from being routed directly to ground. The insulative gap may be filled with air or some other suitable dielectric material, such as a ceramic, a plastic, or the like.

An isolator plate 138 may be disposed between the source distribution plate 122 and the ground shield 140 to prevent the RF and DC energy from being routed directly to ground. The isolator plate 138 has a central opening to allow the feed structure to pass through the isolator plate 138 and be coupled to the source distribution plate 122. The isolator plate 138 may comprise a suitable dielectric material, such as a ceramic, a plastic, or the like. Alternatively, an air gap may be provided in place of the isolator plate 138. In embodiments where an air gap is provided in place of the isolator plate, the ground shield 140 may be structurally sound enough to support any components resting upon the ground shield 140.

The target 106 may be supported on a grounded conductive aluminum adapter 142 through a dielectric isolator 144. The target 106 comprises a material to be deposited on the substrate 104 during sputtering, such a metal or metal oxide. In some embodiments, the backing plate 146 may be coupled to the source distribution plate-facing surface 132 of the target 106. The backing plate 146 may comprise a conductive material, such as copper-zinc, copper-chrome, or the same material as the target, such that RF and DC power can be coupled to the target 106 via the backing plate 146. Alternatively, the backing plate 146 may be non-conductive and may include conductive elements (not shown) such as electrical feedthroughs or the like for coupling the source distribution plate-facing surface 132 of the target 106 to the second end 130 of the conductive member 125. The backing plate 146 may be included for example, to improve structural stability of the target 106.

The substrate support 102 has a material-receiving surface facing the principal surface of the target 106 and supports the substrate 104 to be sputter coated in planar position opposite to the principal surface of the target 106. The substrate support 102 may support the substrate 104 in a first volume 113 of the chamber 100. The first volume 113 is defined as the region above the substrate support 102 during processing (for example, between the target 106 and the substrate support 102 when in a processing position).

In some embodiments, the substrate support 102 may be vertically movable through a bellows 150 connected to a bottom chamber wall 152 to allow the substrate 104 to be transferred onto the substrate support 102 through a load lock valve (not shown) in the lower portion of processing the chamber 100 and thereafter raised to a deposition, or processing position. One or more processing gases may be supplied from a gas source 154 through a mass flow controller 156 into the lower part of the chamber 100. An exhaust port 158 may be provided and coupled to a pump (not shown) via a valve 160 for exhausting the interior of the chamber 100 and facilitating maintaining a pressure inside the chamber 100.

An RF bias power source 162 may be coupled to the substrate support 102 in order to induce a negative DC bias on the substrate 104. In addition, in some embodiments, a negative DC self-bias may form on the substrate 104 during processing. For example, RF power supplied by the RF bias power source 162 may range in frequency from about 2 MHz to about 60 MHz, for example, non-limiting frequencies such as 2 MHz, 13.56 MHz, or 60 MHz can be used. Optionally, a second RF bias power source (not shown) may be coupled to the substrate support 102 and provide any of the frequencies discussed above for use with the RF bias power source 162. In other applications, the substrate support 102 may be grounded or left electrically floating. For example, a capacitance tuner 164 may be coupled to the substrate support for adjusting voltage on the substrate 104 for applications where RF bias power may not be desired. In some embodiments, the capacitance tuner 164 may be used to adjust the substrate floating potential so that ion energy arriving at the substrate can be controlled. In some embodiments, the RF bias power source 162 and the capacitance tuner 164 may both be applied simultaneously.

A rotatable magnetron assembly 136 may be positioned proximate a back surface (e.g., source distribution plate-facing surface 132) of the target 106. The rotatable magnetron assembly 136 includes the magnetron 107 which connects to a rotation shaft 170 coincident with the central axis of the chamber 100 and the substrate 104. A motor 172 can be coupled to the upper end of the rotation shaft 170 to drive rotation of the magnetron assembly 136. The magnets 103 produce a magnetic field within the chamber 100, generally parallel and close to the surface of the target 106 to trap electrons and increase the local plasma density, which in turn increases the sputtering rate. The magnets 103 produce an electromagnetic field around the top of the chamber 100, and the magnets are rotated to rotate the electromagnetic field which influences the plasma density of the process to more uniformly sputter the target 106. For example, the rotation shaft 170 may make about 0 to about 150 rotations per minute.

The chamber 100 further includes a process kit shield, or shield 174, to surround the processing, or first volume 113 of the chamber 100 and to protect other chamber components from damage and/or contamination from processing. In some embodiments, the shield 174 may be a grounded shield connected to a ledge 176 of an adapter 142

The shield 174 extends downward and may include one or more sidewalls 180 configured to surround the first volume 113. The shield 174 extends downward along the walls of the adapter 142 and the chamber wall 108 to below an upper surface of the substrate support 102, radially inward, and then returns upward to form an upwardly extending lip 188, for example, reaching an upper surface of the substrate support 102 (e.g., forming a u-shaped portion 184 at the bottom). Alternatively, the bottommost portion of the shield 174 need not be a u-shaped portion 184 and may have any suitable shape. A first ring 148 (i.e., a cover ring) rests on the top of the upwardly extending lip 188 of the shield 174 when the substrate support 102 is in its lower, loading position (as shown in FIG. 3C). When the substrate support 102 is in its upper position (as illustrated in FIG. 1 and FIG. 3A), the first ring 148 rests on the top of the upwardly extending lip 188 of the shield 174 and the outer periphery of the substrate support 102.

An additional second ring 111 (i.e., a deposition ring) may be used to protect the substrate support 102 from sputter deposition. For example, the second ring 111 may be disposed about a peripheral edge of the substrate support 102 and adjacent to the substrate processing surface 109 as illustrated in FIG. 1. In some embodiments, the second ring 111 may shield exposed surfaces of the substrate support 102 as shown.

Figure 2:
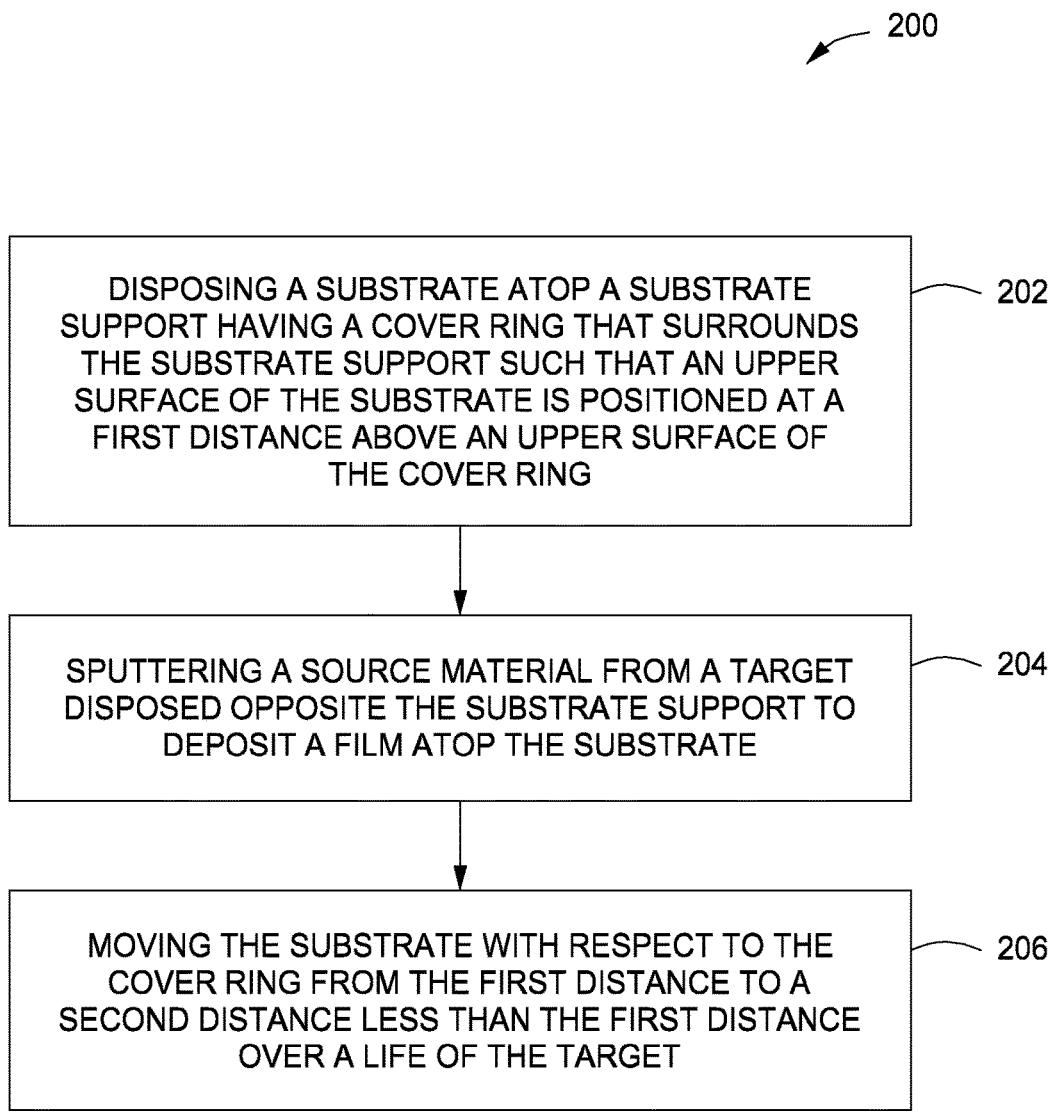
FIG. 2 depicts a flow chart of a method for processing a substrate in a physical vapor deposition chamber in accordance with some embodiments of the present disclosure.

FIG. 2 depicts a method 200 of processing a substrate 104 in a physical vapor deposition chamber, for example the chamber 100 depicted in FIG. 1, in accordance with some embodiments of the present disclosure. The method 200 generally begins at 202, where a substrate 104 is disposed atop a substrate support 102. FIGS. 3A-3C depict schematic side views of a portion of the substrate support 102 in accordance with some embodiments of the present disclosure.

Figure 3A:
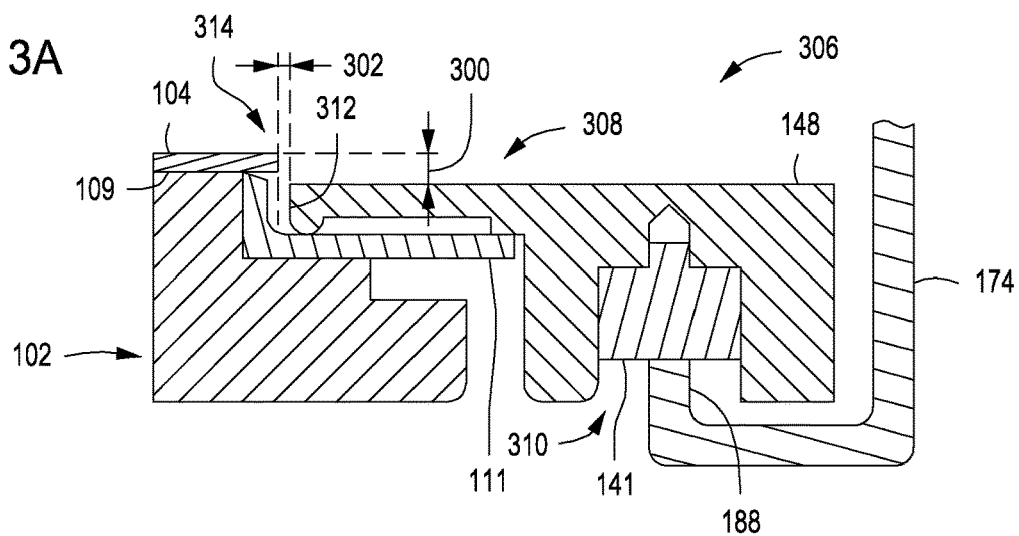
FIG. 3A-3C depicts a partial schematic cross sectional view of a substrate support and surrounding structure in accordance with some embodiments of the present disclosure.
Figure 3B:
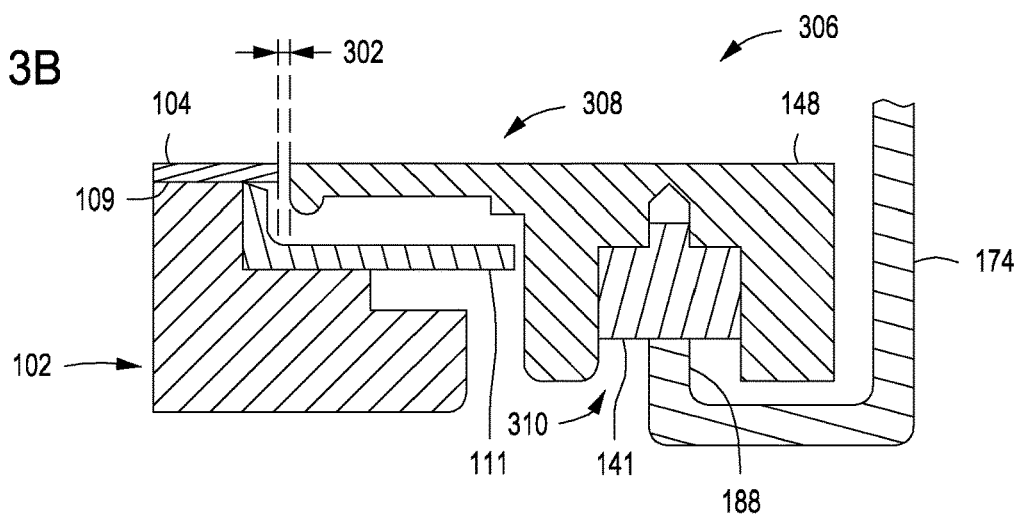
Figure 3C:
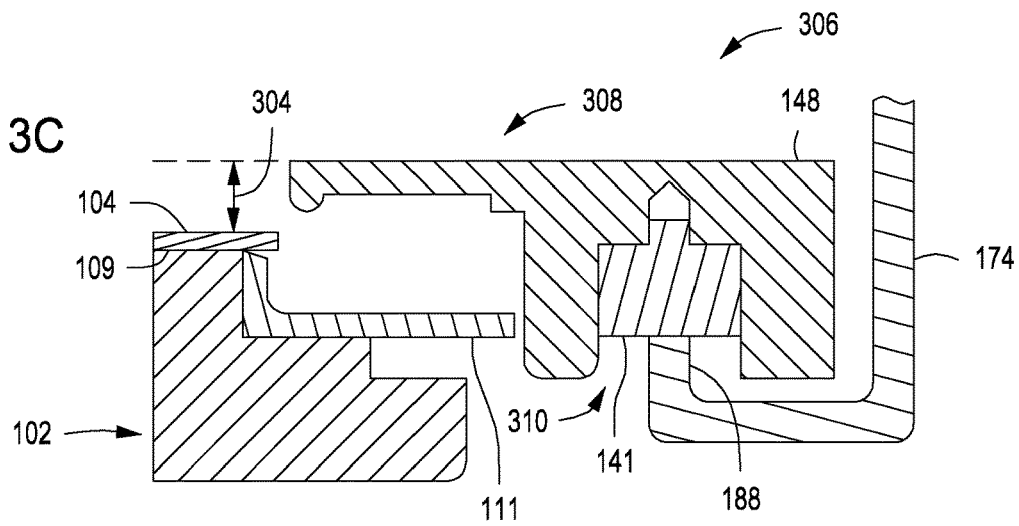

As depicted in FIG. 3A, when the substrate support 102 is in the upper position, the first ring 148 surrounds the substrate support 102 such that an upper surface of the substrate 104 is positioned at a first distance 300 above an upper surface of the first ring 148. In some embodiments, at the beginning of the target life, the first distance 300 is any suitable distance to maintain a low non-uniformity of the film deposited on the substrate, for example above the upper surface of the first ring 148, or in some embodiments, about 3 mm above the upper surface of the first ring 148. When at the first distance above the upper surface of the first ring 148, the first ring 148 does not shield the edges of the substrate 104 from deposition.

As depicted in FIG. 3A, the first ring 148 (i.e., a cover ring) has a first portion 306 and a second portion 308 extending away from the first portion 306 toward the substrate processing surface 109. The first portion 306 comprises an opening 310 having a ceramic isolator 141 disposed within the opening 310. When the substrate support 102 is in its upper position (as illustrated in FIG. 1 and FIG. 3A) the ceramic isolator 141 supports the first ring 148 on the top of the upwardly extending lip 188 of the shield 174 and the second portion 308 of the first ring 148 rests on the second ring 111 at the outer periphery of the substrate support 102. The second portion 308 of the first ring 148 comprises a peripheral edge 312 that is a horizontal distance 302 away from a peripheral edge 314 of the substrate 104. In some embodiments, the horizontal distance 302 from the peripheral edge 312 of the first ring 148 to the peripheral edge 314 of the substrate 104 is about 2.5 mm to about 5 mm, for example about 3.2 mm. The inventors have observed that maintaining a horizontal distance 302 of about 2.5 mm to about 3.5 mm between the peripheral edge 312 of the first ring 148 to the peripheral edge 314 of the substrate 104 advantageously improves the ability of the first ring 148 to shield the periphery of the substrate 104 from deposition when the first ring 148 is moved to a position above the substrate 104, as discussed below.

Next, at 204, source material from the target 106 disposed opposite the substrate support 102 is sputtered to deposit a film atop the substrate 104. In some embodiments, the source material may be a material such as a metal, metal oxide, metal alloy. In some embodiments, the source material may be copper. The inventors have observed that at the beginning of the target life the deposition rate of source material sputtered from the target 106 is greater proximate the center of the substrate 104 than the deposition rate proximate the peripheral edge 314 of the substrate 104. However, over the life of the target 106 the deposition rate at the peripheral edge 314 of the substrate 104 becomes greater than the deposition rate at the center of the substrate 104. Though not wishing to be bound by theory, the inventors believe that the change in deposition rate is due to the formation of an erosion groove within the target 106 over time. As the change in deposition rate occurs over the course of the target life, source material will be sputtered non-uniformly onto the upper surface of the substrate 104 in a different pattern over the course of the target life.

Next, at 206, the substrate 104 is lowered with respect to the first ring 148 from the first distance 300 to a next distance, for example a second distance (e.g., by lowering the substrate support to a next position). The next distance decreases (i.e. is less than the first distance 300) over the course of a life of the target 106. For example, in some embodiments, a subsequent substrate is placed atop the substrate support 102 and the source material from the target 106 is sputtered to deposit a film atop the subsequent substrate. The lowering of the substrate support to the next position and depositing a film atop subsequent substrates may be repeated until the source material from the target 106 is consumed. The substrate support may be lowered between every subsequent substrate processed or periodically for some subsequent substrates (e.g., after a predetermined number of substrates, after measured film non-uniformity on a processed substrate exceeds a predetermined value, or the like). The amount by which the substrate support 102 is lowered (i.e. the next distance) may be calculated using the formula described below. In some embodiments, the next distance may eventually decrease to zero (where the substrate 104 and first ring 148 are even with each other) or to a negative number (where the substrate 104 is disposed below the first ring 148 rather than above the first ring).

The inventors have observed that, over the life of the target 106, the deposition rate proximate the center decreases faster than the deposition rate proximate the edge of the substrate 104 resulting in a thicker amount of material proximate the edge of the substrate 104 than proximate the center of the substrate 104. Shielding the periphery of the substrate 104 from deposition lowers the deposition rate at the periphery, or edges, of the substrate 104 as compared to the center, which advantageously balances the overall deposition profile in applications where the deposition rate proximate the center of the substrate 104 is lower than the deposition rate at the edge of the substrate 104. Thus, lowering the substrate support 102 from the first distance 300 to the second distance (or from any distance to a next distance) increases the amount of shielding of the periphery of the substrate 104 from deposition by the first ring 148. In some embodiments, as depicted in FIG. 3B, lowering the substrate support 102 to the next distance eventually places the top surface of the substrate 104 parallel to the top surface of the first ring 148. In some embodiments, as depicted in FIG. 3C, lowering the substrate support 102 to a next distance 304 eventually places the top surface of the substrate 104 below the top surface of the first ring 148, for example about 3 mm to about 10 mm below the first ring 148 (e.g., in some embodiments, a final distance). As depicted in FIG. 3B and FIG. 3C, as the substrate moves to the next distance, the first ring 148 may eventually be supported only on the top of the upwardly extending lip 188 of the shield 174 by the ceramic isolator 141.

The distance by which the substrate support is lowered may be determined empirically or by modeling. In some embodiments, the distance by which the substrate support is lowered may be determined using the formula $1.1E^{-5}*X^2-0.0167*X+0.2468$, where X represents the target life (i.e., the amount of time the target has been running in kW/hr). The calculated result of the formula yields a number that represents the number of millimeters that the substrate support should be lowered with respect to the initial position (e.g., the first distance). For example, with a new target, the substrate support may initially be positioned such that an upper surface of the substrate 104 is positioned at the first distance 300 above the upper surface of the first ring 148. Upon completion of processing of the first substrate or a number of substrates, the number of kilowatt hours that the target has been running may be used in the above formula to calculate a distance in millimeters that the substrate support may be lowered to (e.g., to provide the upper surface of a subsequent substrate to be positioned at the next distance with respect to the upper surface of the first ring 148). Upon completion of processing of a further subsequent substrate or a number of subsequent substrates, the number of kilowatt hours that the target has been running may again be used to calculate the distance that the substrate support should be positioned in with respect to the initial position of the substrate support. The continuous or periodic lowering of the substrate support may be continued until the target is completely consumed. When a new target is installed, the above-described process may be repeated.

In some embodiments, the substrate support 102 is gradually lowered by the calculated amount over the life of the target 106. Without wishing to be bound by theory, the inventors have observed that adjustment of the distance between the substrate 104 and the first ring 148 affects the plasma sheath. For example, when the first ring 148 is positioned below the substrate 104, for example at a first distance 300, the plasma sheath shifts down to the first ring 148 and out to the shield 174. As the substrate support 102 is lowered and the substrate 104 moves closer to and eventually below the first ring 148, the plasma sheath shifts up to the first ring 148 and then to the shield 174, which results in blocking deposition to the edge of substrate 104. The inventors have observed that moving the substrate 104 from the first distance 300 to a next distance less than the first distance 300 (and from any distance to a next distance) over the life of the target 106 can advantageously maintain non-uniformity at less than 2%.

Returning to FIG. 1, in some embodiments, a magnet 190 may be disposed about the chamber 100 for selectively providing a magnetic field between the substrate support 102 and the target 106. For example, the magnet 190 may be disposed about the outside of the chamber wall 108 in a region just above the substrate support 102 when in processing position. In some embodiments, the magnet 190 may be disposed additionally or alternatively in other locations, such as adjacent the adapter 142. The magnet 190 may be an electromagnet and may be coupled to a power source (not shown) for controlling the magnitude of the magnetic field generated by the electromagnet.

A controller 110 may be provided and coupled to various components of the chamber 100 to control the operation thereof. The controller 110 includes a central processing unit (CPU) 112, a memory 114, and support circuits 116. The controller 110 may control the chamber 100 directly, or via computers (or controllers) associated with particular process chamber and/or support system components. The controller 110 may be one of any form of general-purpose computer processor that can be used in an industrial setting for controlling various chambers and sub-processors. The memory, or computer readable medium, 114 of the controller 110 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 116 are coupled to the CPU 112 for supporting the processor in a conventional manner. These circuits include cache, power supplies, clock circuits, input/output circuitry and subsystems, and the like. Inventive methods as described herein may be stored in the memory 114 as software routine that may be executed or invoked to control the operation of the chamber 100 in the manner described herein. The software routine may also be stored and/or executed by a second CPU (not shown) that is remotely located from the hardware being controlled by the CPU 112.

While the foregoing is directed to embodiments of the present disclosure, other and further embodiments of the disclosure may be devised without departing from the basic scope thereof.

The invention claimed is:

1. A method of processing a substrate in a physical vapor deposition chamber, comprising:
    disposing a substrate atop a substrate support having a cover ring that surrounds the substrate support such that an upper surface of the substrate is positioned at a first distance above an upper surface of the cover ring;
    sputtering a source material from a target disposed opposite the substrate support to deposit a film atop the substrate while maintaining the first distance; and
    lowering the substrate support with respect to the cover ring and sputtering the source material from the target to deposit films atop subsequent substrates such that the distance between the target and the substrate support during sputtering increases over a life of the target.

2. A method of processing a substrate in a physical vapor deposition chamber, comprising:
    disposing a substrate atop a substrate support having a cover ring that surrounds the substrate support such that an upper surface of the substrate is positioned at a first distance above an upper surface of the cover ring;
    sputtering a source material from a target disposed opposite the substrate support to deposit a film atop the substrate while maintaining the first distance; and
    lowering the substrate support with respect to the cover ring and sputtering the source material from the target to deposit films atop subsequent substrates over a life of the target, wherein lowering the substrate support further comprises lowering the substrate support with respect to the cover ring while sputtering source material.

3. The method of claim 1, wherein the first distance is about 3 mm above the cover ring.

4. The method of claim 1, wherein a deposition rate of source material proximate a center of the substrate is greater than the deposition rate of source material proximate an edge of the substrate at the first distance.

5. The method of claim 4, wherein the deposition of source material proximate the edge of the substrate increases over the life of the target.

6. The method of claim 1, wherein lowering the substrate support places the upper surface of the substrate substantially parallel to the cover ring.

7. The method of claim 1, wherein the cover ring comprises a peripheral edge that is a horizontal distance of about 2.5 mm to about 5 mm from a peripheral edge of the substrate.

8. The method of claim 1, wherein a final distance at an end of the life of the target is about 3 mm to about 10 mm below the cover ring.

9. The method of claim 1, wherein the cover ring is electrically isolated.

10. The method of claim 1, wherein the source material is copper.

11. The method of claim 1, wherein lowering the substrate support over the life of the target further comprises maintaining a deposition profile having less than 2% non-uniformity from proximate a center of the substrate to proximate an edge of the substrate for films deposited from the target.

12. A method of processing a plurality of substrates in a physical vapor deposition chamber, comprising:
    (a) sputtering a source material from a target spaced opposite a substrate to deposit a film atop the substrate, wherein the substrate is disposed atop a substrate support having a cover ring that surrounds the substrate support such that an upper surface of the substrate is positioned at a first distance from an upper surface of the cover ring;
    (b) lowering the substrate support to a next position;
    (c) sputtering the source material from the target to deposit a film atop a subsequent substrate at the next position; and
    (d) repeating (b)-(c) until the source material from the target is consumed.

13. The method of claim 12, wherein lowering the substrate support further comprises lowering the substrate support with respect to the cover ring while sputtering source material.

14. The method of claim 12, wherein lowering the substrate support further comprises lowering the substrate support with respect to the cover ring after depositing the film atop the substrate.

15. The method of claim 12, wherein a deposition rate of source material proximate a center of the substrate is greater than the deposition rate of source material proximate an edge of the substrate at the first distance and wherein the deposition of source material proximate the edge of the substrate increases over a life of the target.

* * * * *